United States Patent [19]

Keane

[11] Patent Number: 5,323,329
[45] Date of Patent: Jun. 21, 1994

[54] DIGITALLY ASSISTED POWER LEVELLING CIRCUIT FOR RF POWER GENERATOR

[75] Inventor: Anthony R. A. Keane, Webster, N.Y.

[73] Assignee: ENI, Div. of Astec America, Inc., Rochester, N.Y.

[21] Appl. No.: 812,622

[22] Filed: Dec. 23, 1991

[51] Int. Cl.[5] .................... G01R 21/133; G05B 13/02
[52] U.S. Cl. ..................................... 364/492; 364/481; 364/149; 364/571.07; 455/126
[58] Field of Search .......... 364/149, 150, 151, 571.02, 364/571.04, 571.06, 571.07, 571.08, 480, 481, 483, 492; 307/493, 540, 553, 555; 375/60; 455/115, 116, 126, 127

[56] References Cited

U.S. PATENT DOCUMENTS 5,119,040 6/1992 Long et al. .......................... 455/126

Primary Examiner—Jack B. Harvey
Assistant Examiner—Melanie A. Kemper
Attorney, Agent, or Firm—Harris Beach & Wilcox

[57] ABSTRACT

An RF generator has an analog feedback circuit in combination with a digital levelling assist circuit to compensate for non-linearities in the power metering circuit that measures the RF output energy. The digital leveling assist circuit has a digitizer with inputs coupled to receive the measured power voltage supplied from the power metering circuit and a power demand voltage. The digitizer has outputs that provide digital representations of the measured power voltage and the power demand voltage to a digital control element that derives a digital correction factor based on these digital representations. A d/a converter coupled to the digital control element provides a correction voltage corresponding to this digital correction factor, and this is furnished to a summing circuit that combines the correction voltage with the power demand voltage and with a control voltage that is supplied by the analog feedback circuit. The leveling assist circuit increases the accuracy of control of the RF output power with respect to the power demand voltage, without sacrificing the speed of the analog feedback circuit.

5 Claims, 2 Drawing Sheets

DIGITALLY ASSISTED POWER LEVELLING CIRCUIT FOR RF POWER GENERATOR

BACKGROUND OF THE INVENTION

This invention is directed to controllable RF power generators and is particularly concerned with control circuitry permitting the RF energy to be generated at a predetermined frequency over a range of power levels.

RF power generators are often used in industrial or manufacturing processes, for example, to provide RF energy to generate a plasma for sputter coating or etching applications in the semiconductor industry. In many cases, the applied power must be controlled rather precisely for accurate control of deposition rate.

In the art of deposition or sputtering, for example, the process is driven by radio frequency energy typically provided at a frequency of 13.56 MHz at levels from several watts to several kilowatts. Typically there is an RF generator coupled to the plasma chamber through a matching network. A typical RF power generator employs an analog control loop to achieve fast response with reasonable accuracy over a major portion of the output power range. Most often, the output power (forward and reflected) is metered using a VSWR bridge or directional coupler to form a feedback voltage which is then fed through a squaring circuit to provide a signal that is proportional to the output power. This is then balanced against a control voltage that corresponds to a demand power level. The gain of the power generator is adjusted until the measured power level and the power demand level are in balance. However, because of inaccuracies in the VSWR bridge circuit for measuring output power, especially at lower power levels, the accuracy can be unacceptably low. Thus, it has long been desired to provide an improved feedback system wherein the RF output power is controlled so as to respond linearly to the DC power demand or control voltage.

It has been proposed to employ digital techniques to achieve high accuracy. With a digital system it is possible to compensate for the non-linear characteristic of the metering circuit. However, a digital system tends to be rather slow, and requires a number of cycles to follow any significant changes in the control voltage. On the other hand, a high-speed digital system tends to be rather expensive and complex, and difficult to engineer. Thus, while a digital feedback system would appear to be ideal, its high cost and complexity would tend to disqualify it as a suitable alternative.

It has not been possible in this art to obtain a greater level of accuracy with analog feedback, and provide high accuracy at reasonable costs and without sacrificing the high-speed correction characteristics of analog control.

OBJECTS AND SUMMARY OF THE INVENTION

Accordingly, it is an object of this invention to provide improved control of the output power of an RF power generator, while avoiding the drawbacks of the prior art.

It is a more specific object to provide an analog control loop that is assisted by a rather precise digital correction circuit, so as to obtain the benefits of (a) the high speed of an analog control loop, and (b) the high accuracy of digital control.

According to an aspect of this invention, a digital levelling assist circuit is provided in combination with an analog feedback circuit for controlling the RF output energy level of an RF generator. The digital levelling assist circuit include a/d convertors with inputs coupled to receive the measured power voltage (provided from the metering circuit) and the power demand voltage (corresponding to the power control voltage). These convertors provide digital representations of the measured power demand voltage to a digital control element, which can include a microprocessor device. A digital control element derives a digital correction factor based on the digital representations of the measured power and power demand voltages. A d/a convertor is coupled to the digital control element and provides a correction voltage corresponding to the digital correction factor. This correction voltage is then combined in a summing circuit with the power demand voltage and the control voltage that is provided from the analog control loop. The digital control element derives the digital correction factor in a fashion that compensates for the non-linearities in the metering circuit in the measuring by the latter of the RF output energy. This significantly increases the accuracy of control of the RF output power with respect to the power demand voltage. In a preferred mode, the digital control element includes a read-only memory in which there are stored a number of predetermined look-up values of the digital correction factor for at least certain values along the range of the measured power voltage. For other measured values in between, the digital control element is operative to interpolate between successive ones of these predetermined look-up values.

The above and many other objects, features, and advantages of this invention will become apparent from the ensuing description of a preferred embodiment which should be read in conjunction with the accompanying Drawing.

DETAILED DESCRIPTION OF THE PREFERRED EMBODIMENT

Figure 1:
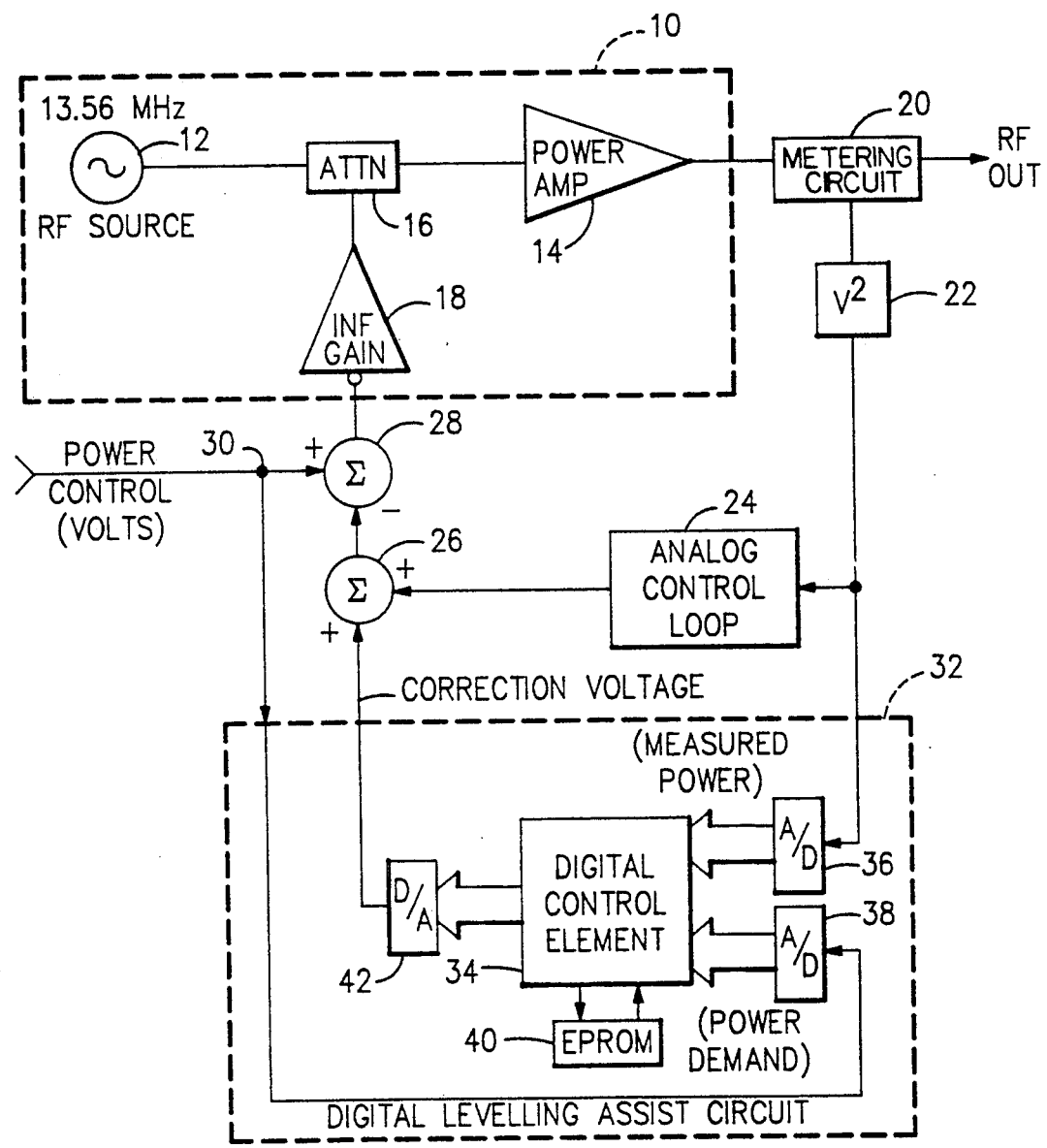
FIG. 1 is a schematic circuit drawing of a controllable RF power generator including a digital level assist circuit according to a preferred embodiment of this invention.

With reference to the Drawing and initially to FIG. 1, an RF power generator circuit 10 comprises generally a group of elements, including an RF small signal source 12, producing radio frequency typically at 13.56 MHz. This RF signal is fed to a radio frequency power amplifier 14 through an attenuator circuit 16 intended to control the power of the output signal from the amplifier 14. The attenuator circuit 16 has a control input to which is coupled a control device, here an infinite gain amplifier 18. A feedback signal applied to an input terminal of the amplifier 18 adjusts the output power of the RF energy provided from the amplifier 14.

Also shown in FIG. 1 is a metering circuit 20 which derives a voltage that is proportional to the voltage or amplitude of the output energy wave from the RF power generator 10. This output voltage is provided to a squaring circuit 22 whose output is then proportional to the measured power produced by the RF power generator 10. An analog control loop 24 has an input coupled to the squaring circuit 22 and an output that provides a feedback voltage which is proportional to the measured output power, to one input of a first summer circuit 26 whose output is coupled to an input of a second summer circuit 28. A power control voltage, i.e. a selected dc voltage is applied via a power control terminal 30 to another input of the summer circuit 28. A power demand voltage from terminal 30 and a feedback voltage from the controller 24 are combined and fed to the infinite gain amplifier 18. The strength of the RF output energy is then adjusted until the power demand voltage and the fed back voltage match one another.

Because of problems of non-linearity of the metering circuit 20, the RF output power does not have a strict linear relation with the power control voltage or demand level. This is especially true at lower power levels, where the metering circuit has more exaggerated non-linear characteristics. For that reason, the present invention incorporates a digital levelling assist circuit 32. In the circuit 32, there is a digital control element 34, comprising a suitably programmed microprocessor, or digital logic with a first a/d convertor 36 whose input is connected to the squaring circuit 22 and which has an output providing a digital representation of the measured power level to the digital control element 34. A second a/d convertor 38 has an input coupled to the power control terminal 30, and an output providing a digital representation of the power demand level to the digital control element 34. The latter has an associated memory device, typically an erasable electrically programmable read-only memory (EEPROM) 40, which contains a look-up table of correction values corresponding to the non-linearities of the metering circuit 20. If desired, the look-up table contained in the EEPROM 40 can be a complete table containing all possible points. However, in order to conserve memory, and yet obtain suitable results, it is preferred to employ selected points representing the non-linear curve of the metering circuit 20. For intermediate power values, i.e., between the predetermined points stored in the EEPROM 40, an interpolation can be carried out by known techniques in the digital control element 34. The digital control element 34 then derives a correction factor based on the digital representations of the measured power and power demand, i.e., on the digital values provided by the convertors 36 and 38.

The digital correction value is then furnished as a digital signal to a d/a convertor 42, which converts the correction factor to a correction voltage which is supplied to an input of the summer circuit 26. Thus, the correction voltage furnished by the digital level assist circuit 32 compensates for the non-linearities in the metering circuit 20 by adding the correction voltage to the control voltage that is supplied by the analog control loop 24.

The analog control feedback loop which is comprised of the elements 22, 24, 26, and 28 provides a fast response to changes in the power demand level, but may be somewhat inaccurate, especially at the low power end of the power range, because of the above-mentioned non-linearities of the metering circuit. The digital levelling assist circuit 32 provides a suitable correction voltage to compensate for these non-linearities, and significantly increases the accuracy of control of the RF power generator. The digital correction may take several cycles, e.g. a few milliseconds, to reach equilibrium, depending on the size of fluctuations of the output power or of the changes in power demand. The combination of the analog control loop and the digital levelling assist circuit provide excellent control for long-term, steady-state applications, that is, for devices such as plasma chambers where precise control of RF power is necessary and where the application of power lasts for at least a few seconds.

Figure 2:
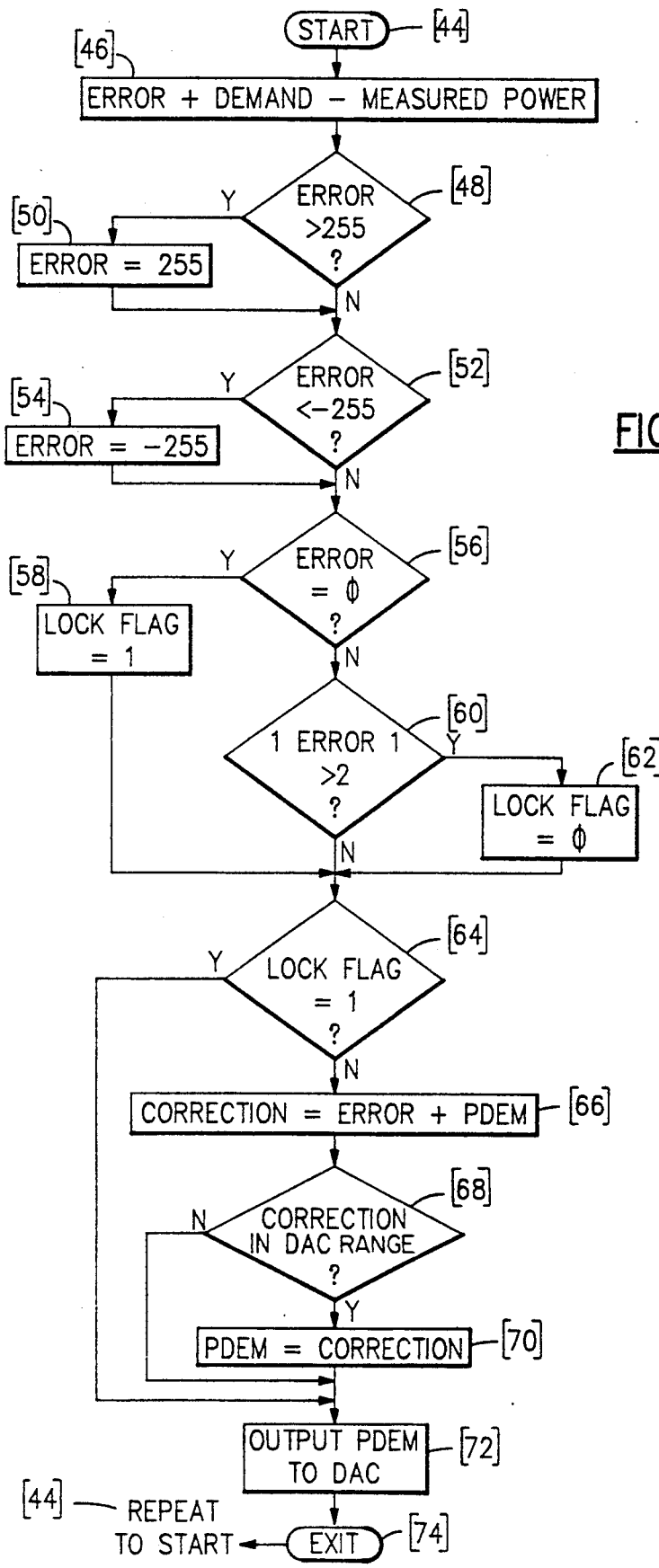
FIG. 2 is a flow chart for explaining the operation of the digital level assist circuit of this invention.

The operation of the digital levelling assist circuit 32 can be explained with respect to the flow chart of FIG. 2. For a given cycle, the process begins at a start [44]in which the a/d convertors 36 and 38 sample the measured power and power demand respectively. Then, as shown in step [46]an error value is calculated based on the digital representations of the power demand and the measured power. If there is a larger error value, resulting from a large fluctuation in either the power demand or the measured output power, the error value is limited so that the amount of digital correction will occur as a predetermined maximum increment for any given cycle. The error value is checked (decision block [48]) to see if it exceeds a predetermined maximum value, here 255. If the error value is over this predetermined maximum value, then the error value is set at the predetermined maximum (block [50]). The error is also checked to see if it is less than a predetermined maximum negative value, here minus 255 (decision block [52]). If the error is more negative than this value, then the error is set to the predetermined maximum negative value [54]. To prevent hunting or ringing, the error value is checked to see if it is at least a certain minimum figure. Here, the error is checked (decision block [56]) and if the error value equals zero, then a lock flag is set at "1" (block [58]). If the error value has an absolute value greater than "2" (decision block [60]), then the lock flag is set at "0" (block [62]). After this, the lock flag value is checked (decision block [64]), and if the lock flag equals "1" the process goes down to a subsequent step [72]. However, if the lock flag equals "0", a correction factor is determined, based on the error value and a predetermined power demand value that is supplied by the EEPROM 40 (block [66]). The value of this digital correction factor is then checked to see if it is within the range of the d/a convertor 42 (decision block [68]). If not, then the procedure goes directly to the subsequent step [72]. However, if this correction factor is within the range of the d/a convertor 42 this new correction factor is latched to inputs of the d/a circuit 42 (block [70]), and this correction value is furnished to the convertor 42 (block [72]). If the lock flag equals "1" or if the correction value is outside the range of the convertor 42, then a previously existing correction value is output from the d/a convertor 42, as shown in block [72]. In a subsequent step [74], the program repeats to the start [44]and the error and correction factors are recomputed in the fashion described above, depending on subsequent sample values of the power demand and measured power.

While this invention has been described in detail with respect to a preferred embodiment, it should be understood that the invention is not limited to that precise embodiment. Rather, many modifications and variations would present themselves to those skilled in the art without departing from the scope and spirit of this invention as defined in the appended claims.

What is claimed is:

1. In an RF generator that provides RF output energy at a predetermined frequency and at an output power level that corresponds to a power demand voltage applied thereto, wherein an RF signal is applied from an RF source to controllable RF power amplifier means which has a control input and an output at which metering circuit means provides a measured power voltage that represents a measured power level of the RF output energy, and in which an analog feedback circuit includes an analog control loop with an input provided with said measured power voltage and an output that provides a control voltage to one input of a summer circuit, the latter having a second input provided with said power demand voltage and an output coupled to the control input of the RF power amplifier means such that the output power level thereof corresponds to the power demand voltage; the combination, with said analog feedback circuit, of a digital levelling assist circuit to compensate for non-linearities in said metering circuit means in its measuring of said RF output energy, thereby to increase the accuracy of control of the RF output energy with respect to said power demand voltage, the digital levelling assist circuit comprising digitizing means with inputs coupled to receive said measured power voltage and said power demand voltage and an output providing digital representations of said measured power voltage and said power demand voltage, a digital control element which derives a digital correction factor based on said digital representations of the measured power and power demand voltages, d/a converter means coupled to said digital control element for providing a correction voltage corresponding to said digital correction factor, and said summer circuit including means coupled to said d/a converter means for combining said correction voltage with said power demand voltage and said control voltage.

2. The digital levelling assist circuit according to claim 1 wherein said digital control element includes a read only memory in which are stored a plurality of predetermined look-up values of said digital correction factor for at least certain values of said measured power voltage.

3. The digital levelling assist circuit according to claim 2, wherein said digital control element is operative to interpolate between said predetermined look-up values to produce said digital correction factor for values of said measured power voltage between said certain values thereof.

4. The digital levelling assist circuit according to claim 1 wherein for differences between said power demand voltage and said measured power voltage exceeding a predetermined maximum error range, said digital control element is operative to set an error value at a predetermined maximum error value, and to produce said digital correction factor based on said digital representation of said power demand voltage and said predetermined maximum error voltage.

5. The digital levelling assist circuit according to claim 1 wherein said digital control element is operative to maintain a previous value of said correction voltage if the values of said measured power voltage and said power demand voltage are such that the corresponding correction factor exceeds a predetermined value corresponding to the capacity of said d/a converter means.

* * * * *